United States Patent
Sell et al.

(10) Patent No.: US 12,248,246 B2
(45) Date of Patent: Mar. 11, 2025

(54) FREEFORM OPTICAL SUBSTRATES IN WAVEGUIDE DISPLAYS

(71) Applicant: Applied Materials, Inc., Santa Clara, CA (US)

(72) Inventors: David Alexander Sell, Santa Clara, CA (US); Samarth Bhargava, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/398,409

(22) Filed: Dec. 28, 2023

(65) Prior Publication Data

US 2024/0126166 A1 Apr. 18, 2024

Related U.S. Application Data

(63) Continuation of application No. 18/337,289, filed on Jun. 19, 2023, now Pat. No. 12,044,964, which is a continuation of application No. 17/315,613, filed on May 10, 2021, now Pat. No. 11,720,016.

(51) Int. Cl.
*G03F 7/00* (2006.01)
*G02B 25/00* (2006.01)

(52) U.S. Cl.
CPC ......... *G03F 7/0005* (2013.01); *G02B 25/001* (2013.01)

(58) Field of Classification Search
CPC ............................ G03F 7/0005; G02B 25/001
USPC .......................................................... 359/643
See application file for complete search history.

(56) References Cited

U.S. PATENT DOCUMENTS

| | | |
|---|---|---|
| 2002/0135778 A1 | 9/2002 | Folta et al. |
| 2004/0191407 A1 | 9/2004 | Ohbayashi |
| 2009/0217516 A1 | 9/2009 | Pawlowski et al. |

FOREIGN PATENT DOCUMENTS

| | | |
|---|---|---|
| JP | 05186233 A | 7/1993 |
| JP | 2006156515 A | 6/2006 |
| JP | 2015534135 A | 11/2015 |
| JP | 2016151733 A | 8/2016 |
| JP | 2016224288 A | 12/2016 |
| KR | 1020090073720 A | 7/2009 |
| WO | 2019173113 A1 | 9/2019 |
| WO | 2021076285 A1 | 4/2021 |

OTHER PUBLICATIONS

International Search Report/ Written Opinion issued to PCT/US2022/025232 on Aug. 10, 2022.
Japanese Office Action issued to patent application No. 2023-568667 on Dec. 17, 2024.

*Primary Examiner* — William Choi
(74) *Attorney, Agent, or Firm* — Patterson + Sheridan, LLP

(57) ABSTRACT

Embodiments of the present disclosure generally relate to methods of forming a substrate having a target thickness distribution at one or more eyepiece areas across a substrate. The substrate includes eyepiece areas corresponding to areas where optical device eyepieces are to be formed on the substrate. Each eyepiece area includes a target thickness distribution. A base substrate thickness distribution of a base substrate is measured such that a target thickness change can be determined. The methods described herein are utilized along with the target thickness change to form a substrate with the target thickness distribution.

20 Claims, 9 Drawing Sheets

FREEFORM OPTICAL SUBSTRATES IN WAVEGUIDE DISPLAYS

CROSS-REFERENCE TO RELATED APPLICATIONS

This application is a Continuation application of U.S. patent application Ser. No. 18/337,389, Filed Jun. 19, 2023 which is a Continuation application of U.S. Pat. No. 17,315,613, filed May 10, 2021, and assigned to the assignee hereof, the contents of which is hereby incorporated by reference in their entirety.

BACKGROUND

Field

Embodiments of the present disclosure generally relate to optical devices. More specifically, embodiments described herein provide for forming a substrate having the same thickness distribution at one or more eyepiece areas across a substrate.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as optical device eyepieces to display a virtual reality environment that replaces an actual environment.

Augmented reality, however, enables an experience in which a user can still see through the optical device eyepieces of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is having the same thickness distribution at one or more areas across a substrate. It is difficult to predict the thickness distribution at each eyepiece area and therefore the thickness distribution at each eyepiece area cannot be accounted for beforehand, leading to an uncontrolled source of variation. Optical device eyepieces which are modeled and optimized under the assumption of a certain thickness distribution will generally perform differently when that thickness distribution is changed, resulting in performance issues. For example, when the thickness distribution at each eyepiece area is unknown, low optical efficiency and poor uniformity of brightness and color across the field of view of the optical device eyepieces formed on or over the substrate will occur. Accordingly, what is needed in the art are methods for forming a substrate having the same thickness distribution at one or more eyepiece areas across a substrate.

SUMMARY

In one embodiment, a method is provided. The method includes measuring a base substrate thickness distribution across a base substrate. The method further includes determining a target thickness change. The target thickness change is determined by subtracting the base substrate thickness distribution from a target thickness distribution. The target thickness distribution corresponds to a thickness across one or more eyepiece areas of a substrate to be formed. The method further includes forming a substrate having the target thickness distribution at the one or more eyepiece areas.

In another embodiment, a method is provided. The method includes planarizing a base substrate having a base substrate thickness distribution. The method further includes determining a target thickness change. The target thickness change is determined by subtracting the base substrate thickness distribution from a target thickness distribution. The target thickness distribution corresponds to a thickness across one or more eyepiece areas of a substrate to be formed. The method further includes forming a substrate having the target thickness distribution at the one or more eyepiece areas.

In yet another embodiment, a substrate is provided. The substrate includes a plurality of inactive areas. The substrate further includes a plurality of eyepiece areas disposed between the plurality of inactive areas. Each eyepiece area defines an area of the substrate to have an optical device eyepiece formed thereon. The plurality of eyepiece areas each have a target thickness distribution across the eyepiece area. The target thickness distribution is defined by a distance between a top surface and a bottom surface of the substrate at the eyepiece area.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods for forming a substrate having the same thickness distribution at one or more eyepiece areas across a substrate. The method includes measuring a base substrate thickness distribution across a base substrate or planarizing a base substrate having a base substrate thickness distribution. The method further includes determining a target thickness change. The target thickness change is determined by subtracting the base substrate thickness distribution from a target thickness distribution. The target thickness distribution corresponds to a thickness across one or more eyepiece areas of a substrate to be formed. The method further includes forming a substrate having the target thickness distribution at the one or more eyepiece areas. The substrate includes a plurality of inactive areas. The substrate further includes a plurality of eyepiece areas disposed between the plurality of inactive areas. Each eyepiece area defines an area of the substrate to have an optical device eyepiece formed thereon. The plurality of eyepiece areas each have a target thickness distribution across the eyepiece area. The target thickness distribution is defined by a distance between a top surface and a bottom surface of the substrate at the eyepiece area.

Figure 1A:
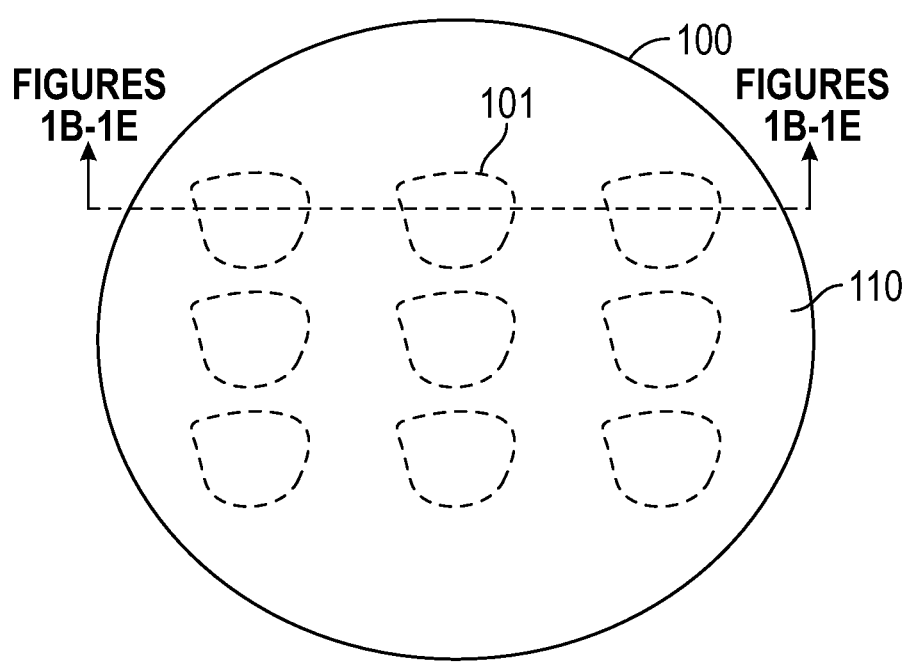
FIG. 1A is a schematic, top view of a substrate according to embodiments.

FIG. 1A is a schematic, top view of a substrate 100. The substrate 100 includes a plurality of eyepiece areas 101. The eyepiece areas 101 are areas over the substrate 100 where one of an optical device eyepiece 1200A-1200C (shown in FIGS. 12A-12C) are to be formed. Although only nine of the eyepiece areas 101 are shown in FIG. 1A, the substrate 100 is not limited in the number of the eyepiece areas 101 corresponding to a number of optical device eyepieces 1200A-1200C to be formed thereon.

FIGS. 1B-1E are schematic, cross-sectional views of a substrate 100 having a target thickness distribution 116. The substrate 100 includes the eyepiece areas 101 disposed across the substrate 100. Inactive areas 104 are disposed between the eyepiece areas 101. The inactive areas 104 are areas of the substrate 100 that will not have one of the optical device eyepieces 1200A-1200C formed thereon. The substrate 100 includes a top surface 110 and a bottom surface 111.

The substrate 100 includes a base substrate 106. In some embodiments, which can be combined with other embodiment described herein, an index matched layer 108 is disposed over the base substrate 106, as shown in FIGS. 1C and 1E. The index matched layer 108 has a refractive index that matches or substantially matches the refractive index of the base substrate 106. The base substrate 106 includes an upper surface 102 and the bottom surface 111.

Figure 12A:
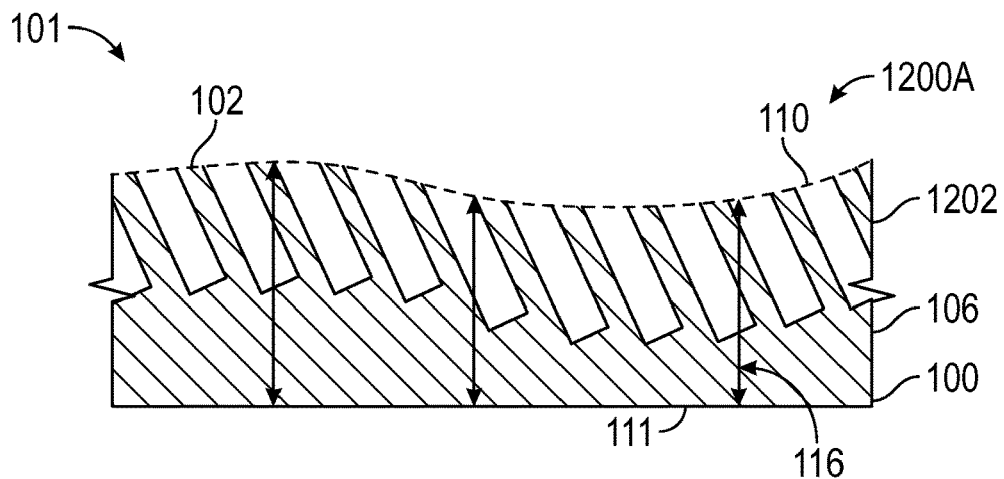
FIGS. 12A-12C are schematic, cross-sectional views of optical device eyepieces according to embodiments.
Figure 12B:
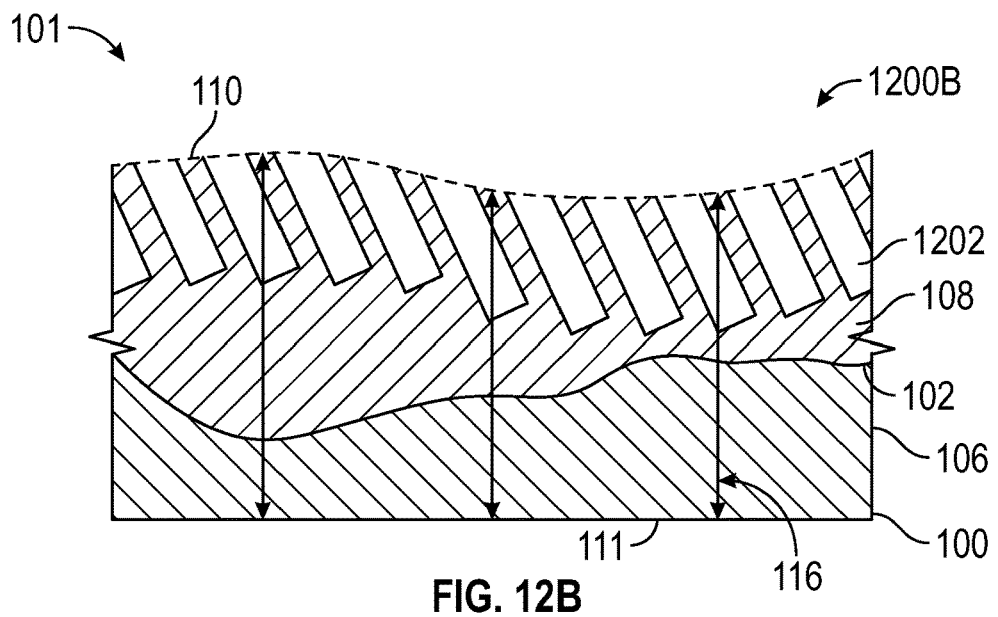
Figure 12C:
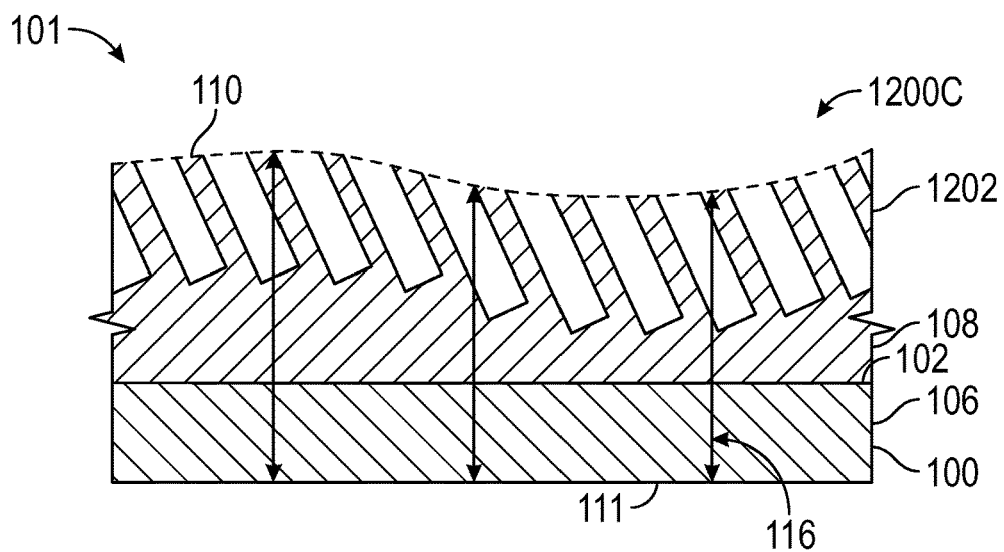

The base substrate 106 and the index matched layer 108 may be formed from any suitable material, provided that the substrate 100 can adequately transmit light in a desired wavelength or wavelength range and can serve as an adequate support for the optical device eyepieces 1200A-1200C (shown in FIGS. 12A-12C). The base substrate 106 and/or the index matched layer 108 may be a material including, but not limited to, amorphous dielectrics, non-amorphous dielectrics, crystalline dielectrics, silicon oxide, polymers, and combinations thereof. In some embodiments, which may be combined with other embodiments described herein, the base substrate 106 and/or the index matched layer 108 includes a transparent material. In one example, the base substrate 106 and/or the index matched layer 108 includes silicon (Si), silicon dioxide ($SiO_2$), fused silica, quartz, silicon carbide (SiC), germanium (Ge), silicon germanium (SiGe), indium phosphide (InP), gallium arsenide (GaAs), gallium nitride (GaN), sapphire, or combinations thereof.

At least the eyepiece areas 101 of the substrate 100 include a target thickness distribution 116. The target thickness distribution 116 is the local thickness distribution that has been determined to be replicated at each of the eyepiece areas 101. The target thickness distribution 116 is defined by the distance between the top surface 110 and the bottom surface 111 of the substrate 100 across the eyepiece area 101. The target thickness distribution 116 may be any linear or nonlinear distribution.

Figure 1B:
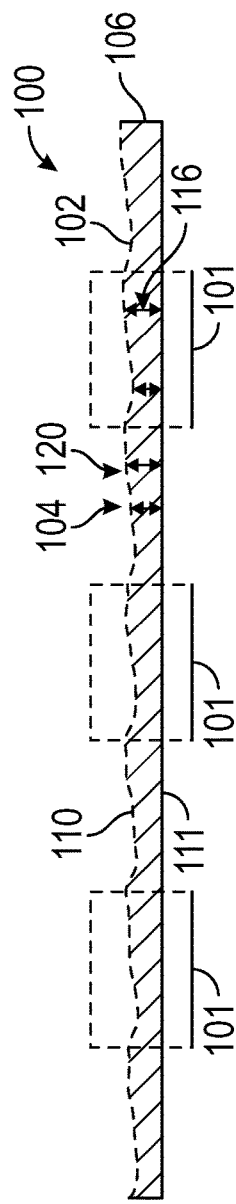
FIGS. 1B-1E are schematic, cross-sectional views of a substrate having a target thickness distribution according to embodiments.
Figure 1C:
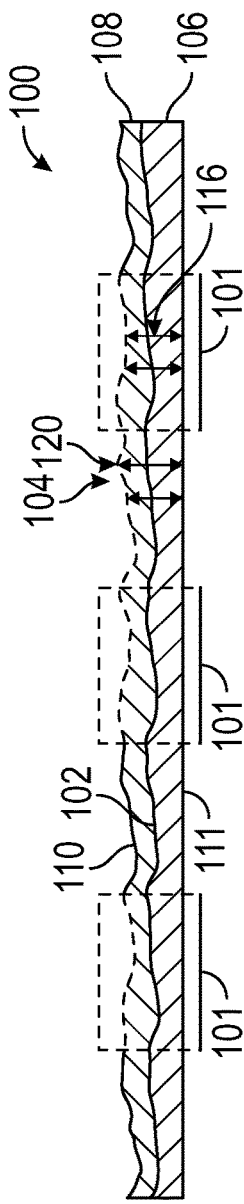

FIGS. 1B and 1C show the target thickness distribution 116 formed in the eyepiece areas 101. The inactive areas 104 of the substrate 100 have an inactive thickness distribution 120, i.e., the inactive thickness distribution 120 does not match the target thickness distribution 116. The inactive thickness distribution 120 is defined by the distance between the top surface 110 and the bottom surface 111 across the inactive area 104 in the inactive areas 104. As shown in FIG. 1B, the target thickness distribution 116 is formed from the base substrate 106 of the substrate 100 at each eyepiece area 101. As shown in FIG. 1C, the target thickness distribution 116 is formed from the index matched layer 108 of the substrate 100 at each eyepiece area 101.

Figure 1D:
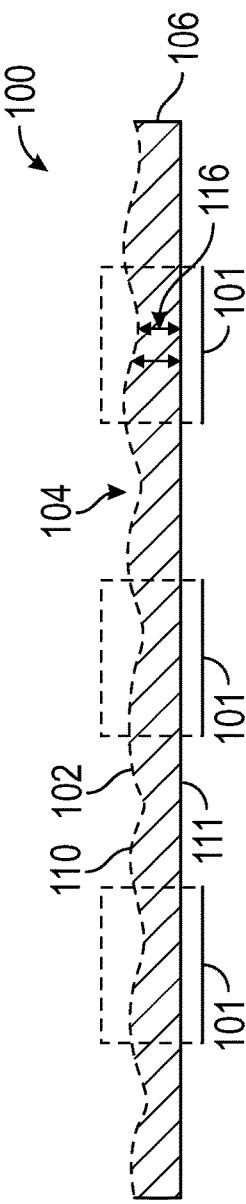
Figure 1E:
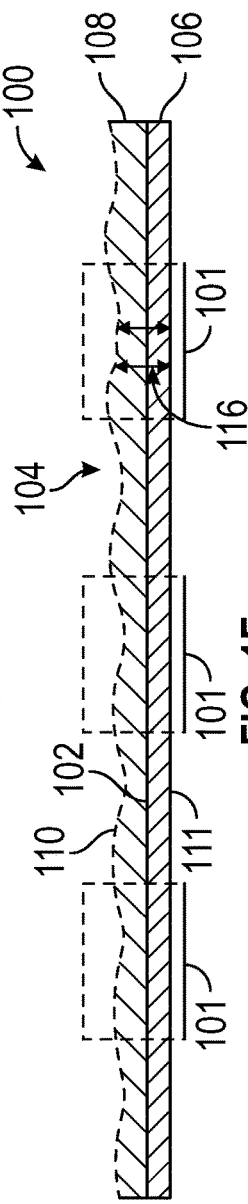

FIGS. 1D and 1E show the target thickness distribution 116 formed in the eyepiece areas 101 and the inactive areas 104. Thus, the target thickness distribution 116 is the same in the eyepiece areas 101 and in the inactive areas 104. As shown in FIG. 1D, the target thickness distribution 116 is formed from the base substrate 106 of the substrate 100 at each eyepiece area 101 and each inactive area 104. As shown in FIG. 1E, the target thickness distribution 116 is formed from the index matched layer 108 of the substrate 100 at each eyepiece area 101 and each inactive area 104.

The target thickness distribution 116 is engineered to improve the performance of the optical device eyepieces 1200A-1200C to be formed thereon. The target thickness distribution 116 is the same in at least each eyepiece area 101 of the substrate 100. Methods described herein will provide for the target thickness distribution 116 to be achieved in at least each eyepiece area 101. The target thickness distribution 116 is not limited to the target thickness distribution 116 shown in FIGS. 1B-1E and may be any thickness distribution determined to be suitable and improve the performance of the optical device eyepieces 1200A-1200C.

While FIGS. 1B-1D depicts the base substrate 106 with the distance between the bottom surface 111 and the upper surface 102 of the base substrate 106 changing across the base substrate 106, in other embodiments, which can be combined with other embodiments described herein, the base substrate 106 is planar such that the distance between the bottom surface 111 and the upper surface 102 of the base substrate 106 is constant across the base substrate 106, as shown in FIG. 1E.

Figure 2:
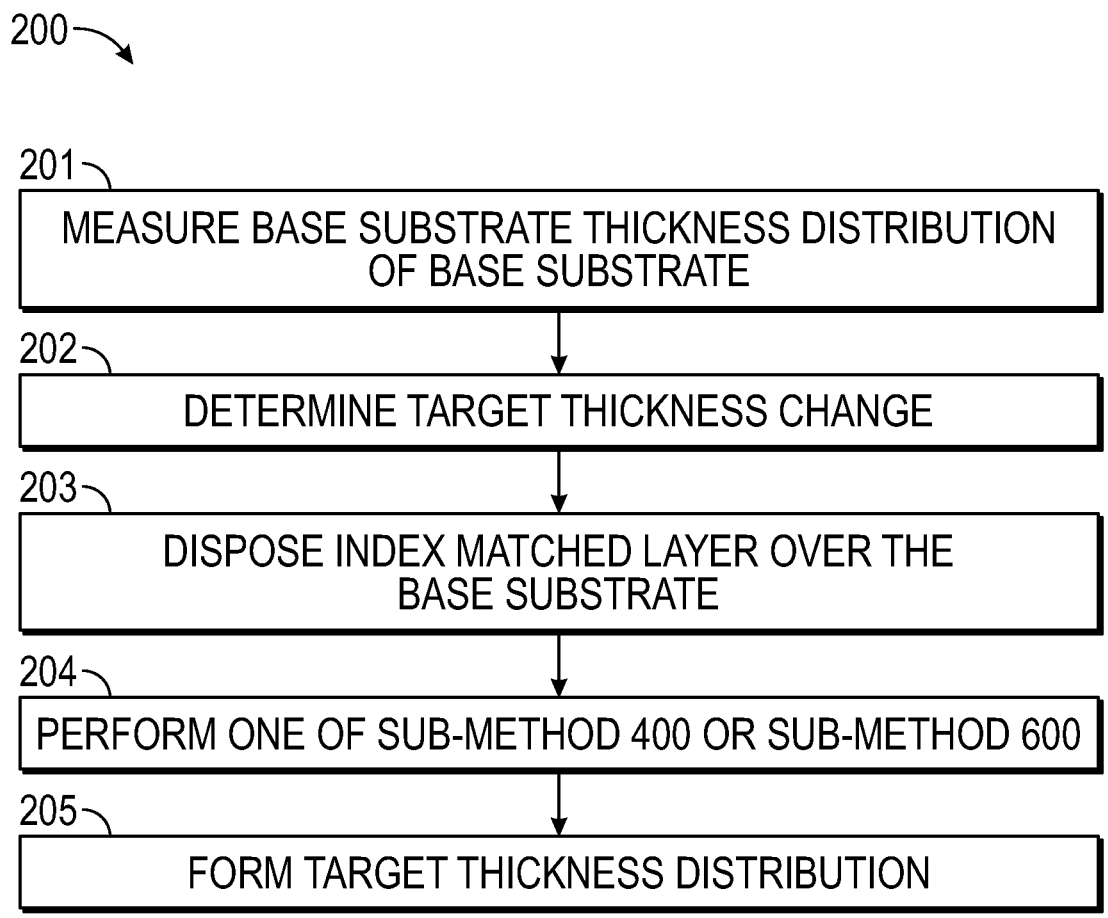
FIG. 2 is a flow diagram of a method for forming a substrate with a target thickness distribution as shown in FIGS. 3A-3D according to embodiments.

FIG. 2 is a flow diagram of a method 200 for forming a substrate 100 with a target thickness distribution 116 as shown in FIGS. 3A-3D. The method 200 may be utilized to form the target thickness distribution 116 in eyepiece areas 101 and/or inactive areas 104 (shown in FIGS. 1B-1E) of the substrate 100. FIGS. 3A-3D are schematic, cross-sectional views of an eyepiece area 101. Although FIGS. 3A-3D correspond to an eyepiece area 101, the FIGS. 3A-3D are not limited to the eyepiece areas 101 and may also correspond to an inactive area 104 where the target thickness distribution 116 is to be formed.

Figure 3A:
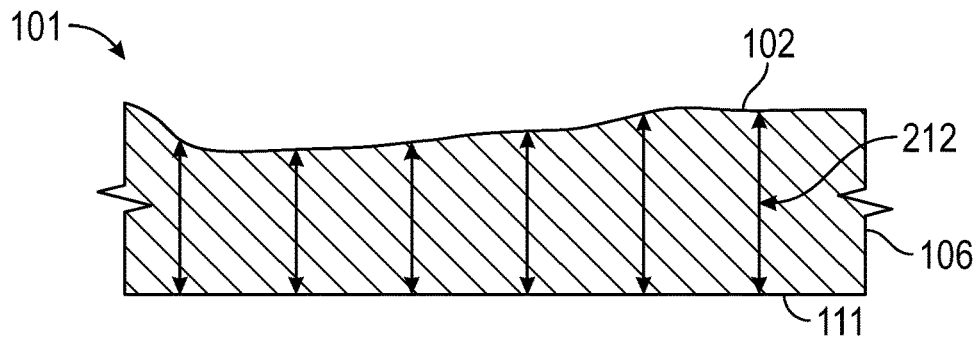
FIGS. 3A-3D are schematic, cross-sectional views of an eyepiece area according to embodiments.

At operation 201, as shown in FIG. 3A, a base substrate thickness distribution 212 of a base substrate 106 is measured. The base substrate thickness distribution 212 is defined by the distance between the bottom surface 111 and an upper surface 102 of the base substrate 106 across the eyepiece area 101. The base substrate thickness distribution 212 is a measured thickness distribution of the base substrate 106 prior to forming the target thickness distribution 116.

At operation 202, a target thickness change is determined. The target thickness change is a thickness change required to form the target thickness distribution 116 from the base substrate thickness distribution 212. The target thickness distribution 116 is determined using the equation:

$$\Delta T = T_{target} - T_{measured} + C$$

where $\Delta T$ is the target thickness change, $T_{target}$ is the target thickness distribution 116 (shown in FIGS. 1B-1E), $T_{measured}$ is the base substrate thickness distribution 212 found in operation 201, and C is a global shift constant corresponding to a location on the base substrate 106. In one embodiment, which can be combined with other embodiments described herein, the global shift constant is zero.

Figure 3B:
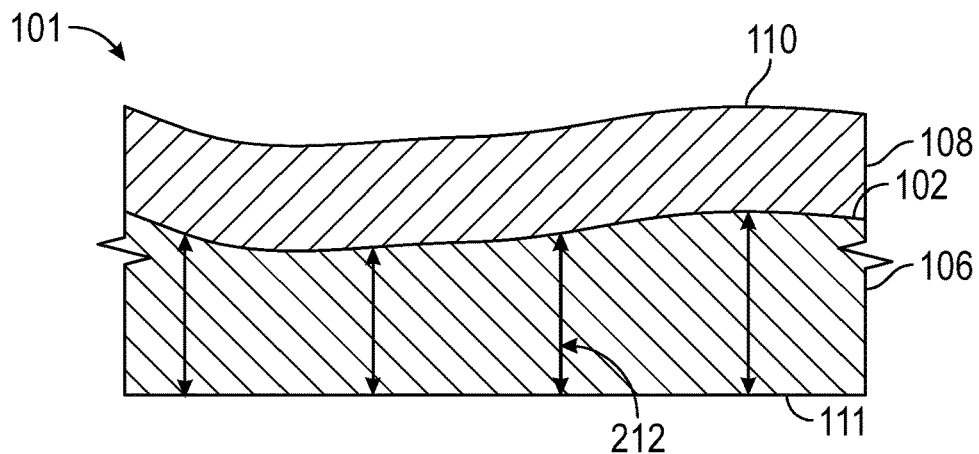

At optional operation 203, as shown in FIG. 3B, an index matched layer 108 is disposed over the base substrate 106. The index matched layer 108 may be disposed over the upper surface 102 of the base substrate 106 by one or more PVD, CVD, PECVD, FCVD, ALD, or spin-on coating processes. The index matched layer 108 has a refractive index that matches or substantially matches the refractive index of the base substrate 106.

Figure 4:
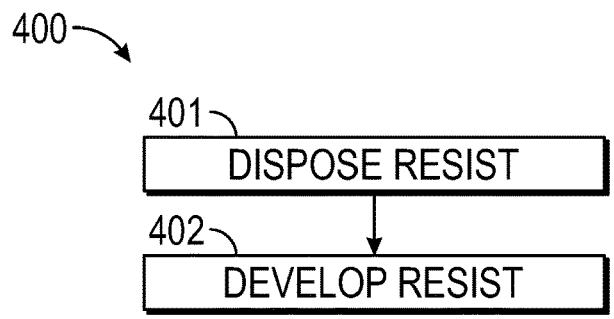
FIG. 4 is a flow diagram of a sub-method for forming a substrate with a target thickness distribution as shown in FIGS. 5A-5D according to embodiments.
Figure 5A:
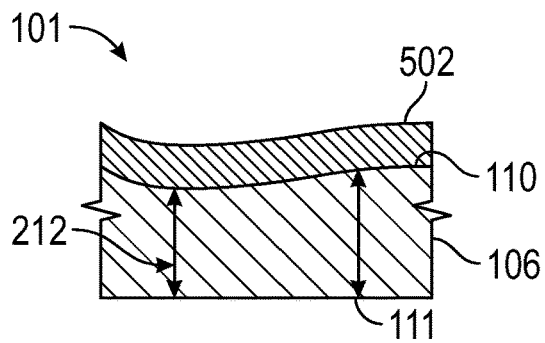
FIGS. 5A-5D are schematic, cross-sectional views of a base substrate during a sub-method for forming a substrate with a target thickness distribution according to embodiments.
Figure 5B:
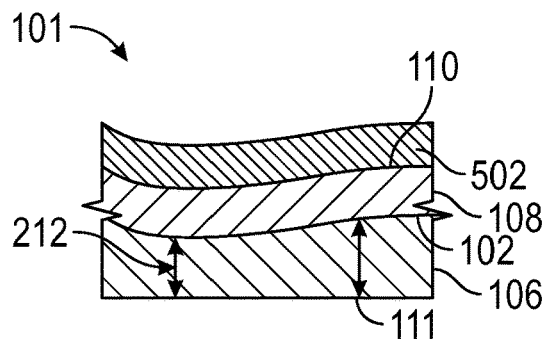

At optional operation 204, one of a sub-method 400 or a sub-method 600 is performed. FIG. 4 is a flow diagram of a sub-method 400 for forming a substrate 100 with a target thickness distribution 116 as shown in FIGS. 5A-5D. FIGS. 5A-5D are schematic, cross-sectional views of a base substrate 106 during a sub-method 400 for forming a substrate 100 with a target thickness distribution 116. At operation 401, as shown in FIGS. 5A and 5B, a resist 502 is disposed. FIG. 5A shows the resist 502 disposed over the base substrate 106. FIG. 5B shows the resist 502 disposed over the index matched layer 108. The material of the resist 502 may include, but is not limited to, light-sensitive polymer containing materials. The resist 502 may be disposed by one or more PVD, CVD, PECVD, FCVD, ALD, and spin-on processes.

Figure 5C:
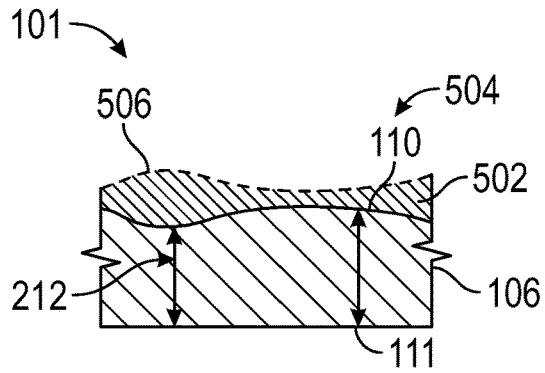
Figure 5D:
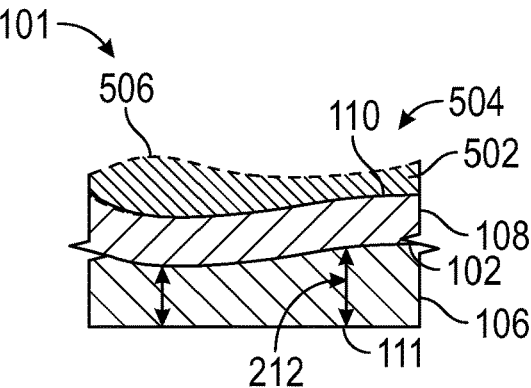

At operation 402, as shown in FIGS. 5C and 5D, the resist 502 is developed. The resist 502 is developed utilizing a lithography process. In one embodiment, which can be combined with other embodiments described herein, the lithography process is a gray-tone lithography process. The lithography process forms a gray-tone distribution 504 of the resist 502. The gray-tone lithography process may include photolithography or digital lithography. The gray-tone distribution 504 has a thickness distribution 506 that corresponds to the target thickness distribution 116 of the substrate 100 to be formed. FIG. 5C shows the resist 502 developed on the base substrate 106. FIG. 5D shows the resist 502 developed on the index matched layer 108.

Figure 6:
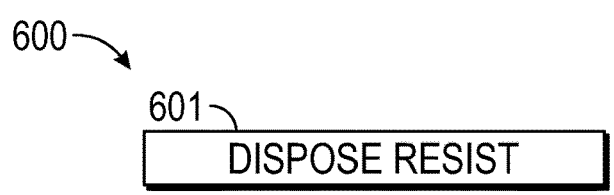
FIG. 6 is a flow diagram of a sub-method method for forming a substrate with a target thickness distribution as shown in FIGS. 7A and 7B according to embodiments.
Figure 7A:
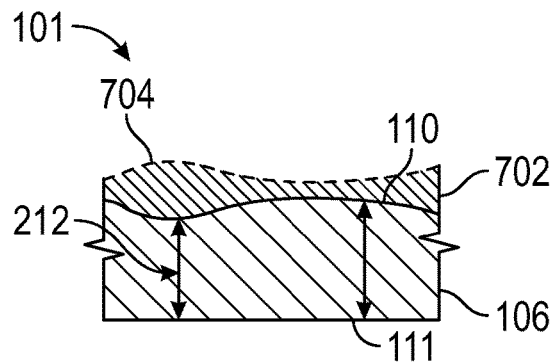
FIGS. 7A-7B are schematic, cross-sectional views of a base substrate during a sub-method for forming a substrate with a target thickness distribution according to embodiments.
Figure 7B:
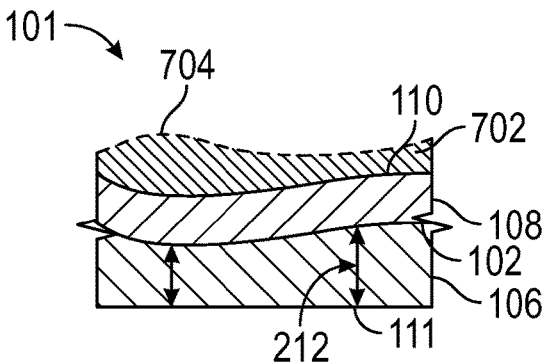

FIG. 6 is a flow diagram of the sub-method 600 for forming a substrate 100 with a target thickness distribution 116 as shown in FIGS. 7A and 7B. FIGS. 7A-7B are schematic, cross-sectional views of a base substrate 106 during the sub-method 600 for forming a substrate 100 with a target thickness distribution 116. At operation 601, a resist 702 is disposed. The material of the resist 702 may include, but is not limited to, light-sensitive polymer containing materials. The resist 702 may be disposed by an inkjet printing process to achieve a thickness distribution 704 that corresponds to the target thickness distribution 116 to be formed. FIG. 7A shows the resist 702 disposed over the base substrate 106. FIG. 7B shows the resist 702 disposed over the index matched layer 108.

Figure 3C:
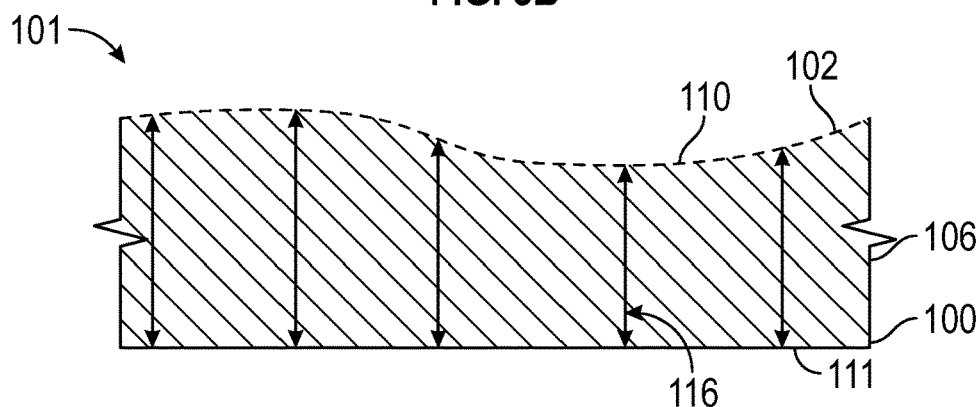
Figure 3D:
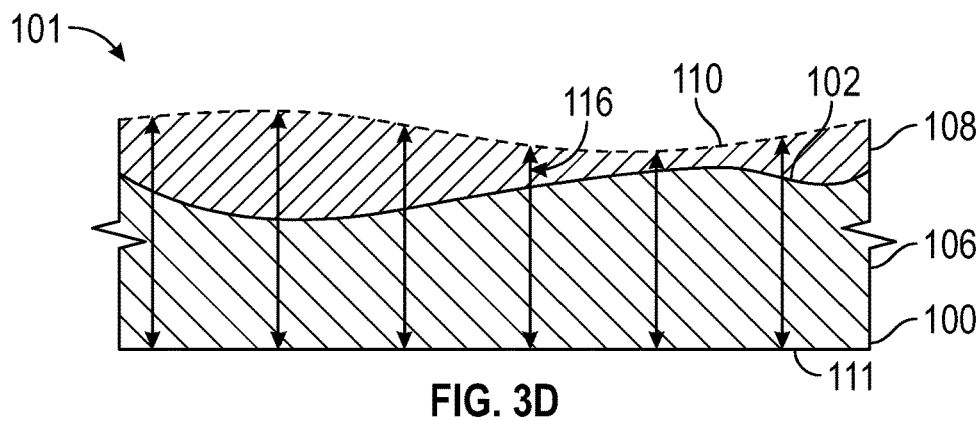

At operation 205, as shown in FIGS. 3C and 3D, a substrate 100 with the target thickness distribution 116 is formed. The target thickness change is utilized to determine the change to the base substrate thickness distribution 212 required to form the target thickness distribution 116. Determining the target thickness change provides for the processes of the operation 205 to be adjusted accordingly to form the target thickness distribution 116 as desired. FIG. 3C shows the target thickness distribution 116 formed in the base substrate 106 of the substrate 100. The substrate 100 of FIG. 3C corresponds to the eyepiece areas 101 shown in FIG. 1B. The substrate 100 of FIG. 3C also corresponds to the eyepiece areas 101 and the inactive areas 104 shown in FIG. 1D. FIG. 3D shows the target thickness distribution 116 formed in the index matched layer 108 of the substrate 100. The substrate 100 of FIG. 3D corresponds to the eyepiece areas 101 shown in FIG. 1C.

In one embodiment, where the sub-method 400 or the sub-method 600 is performed, the target thickness change is utilized such that the target thickness distribution 116 is formed by performing a transfer etch. The transfer etch may include, but is not limited to, at least one of ion implantation, ion beam etching (IBE), reactive ion etching (RIE), directional RIE, plasma etching, and thermal atomic layer etching. The transfer etch produces the target thickness distribution 116 corresponding to the thickness distribution 506 of the sub-method 400 or corresponding to the thickness distribution 704 of the sub-method 600. Any residual portions of the resist 502 or the resist 702 disposed over the substrate 100 are removed.

In another embodiment, which can be combined with other embodiments described herein, when the sub-method 400 and the sub-method 600 are not utilized, the index matched layer 108 may be disposed on the base substrate 106 such that the index matched layer 108 accounts for the target thickness change and forms the target thickness distribution 116 of the substrate 100. The index matched layer 108 may be disposed by an inkjet printing process to achieve the target thickness distribution 116.

In yet another embodiment, which can be combined with other embodiments described herein, when the sub-method 400 and the sub-method 600 are not utilized, the substrate 100 having the target thickness distribution 116 may be formed with a distribution etch process. The distribution etch process may include, but is not limited to, at least one of ion implantation, ion beam etching (IBE), reactive ion etching (RIE), directional RIE, plasma etching, and thermal atomic layer etching. The distribution etch process may directly etch the base substrate 106 or the index matched layer 108 to account for the target thickness change and form the substrate 100 having the target thickness distribution 116. In one embodiment, which can be combined with other embodiments described herein, the base substrate 106 may be angled and rotated such that the distribution etch process may form the target thickness distribution 116. Additionally, when the index matched layer 108 is disposed over the upper surface 102 of the base substrate 106, the distribution etch process may directly etch the index matched layer 108 to form the substrate 100 having target thickness distribution 116.

The target thickness distribution 116 shown in FIGS. 3C and 3D is a result of utilizing the target thickness change of the method 200. The target thickness distribution 116 may be formed at each eyepiece area 101. Therefore, the target thickness distribution 116 across the substrate 100 at each eyepiece area 101 is the same. Each eyepiece area 101 having the target thickness distribution 116 will allow for reduced variability in the optical device eyepieces 1200A-1200C to be formed thereon.

Figure 8:
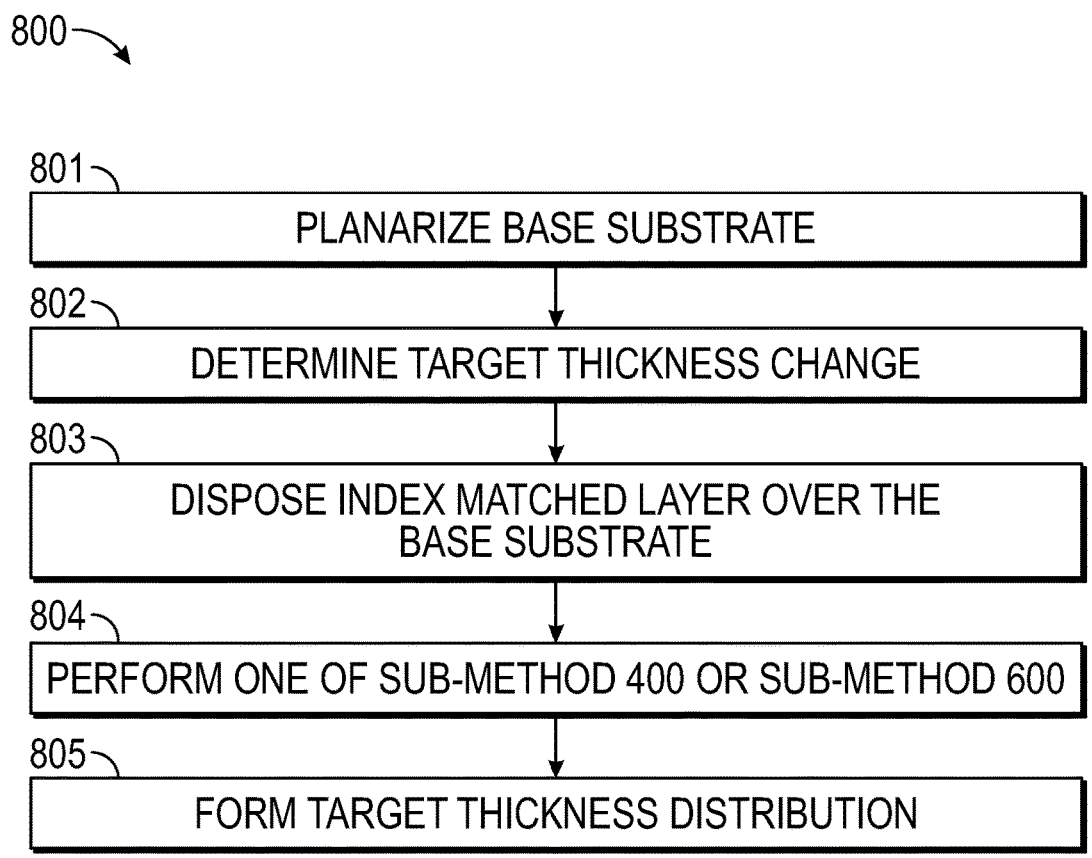
FIG. 8 is a flow diagram of a method for forming a substrate with a target thickness distribution as shown in FIGS. 9A-9D according to embodiments.

FIG. 8 is a flow diagram of a method for forming a substrate 100 with a target thickness distribution 116 as shown in FIGS. 9A-9D. The method 800 may be utilized to form the target thickness distribution 116 in eyepiece areas 101 and/or inactive areas 104 of the substrate 100. FIGS. 9A-9D are schematic, cross-sectional views of an eyepiece area 101. Although FIGS. 9A-9D correspond to a eyepiece area 101, the FIGS. 9A-9D are not limited to the eyepiece areas 101 and may also correspond to an inactive area 104 where the target thickness distribution 116 is to be formed.

Figure 9A:
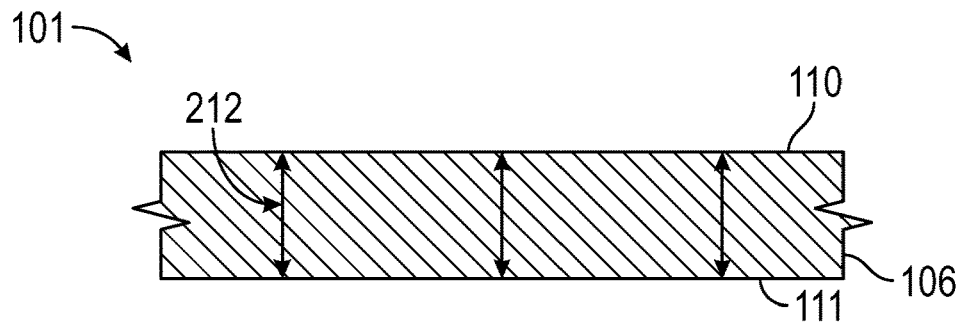
FIGS. 9A-9D are schematic, cross-sectional views of an eyepiece area according to embodiments.
Figure 9B:
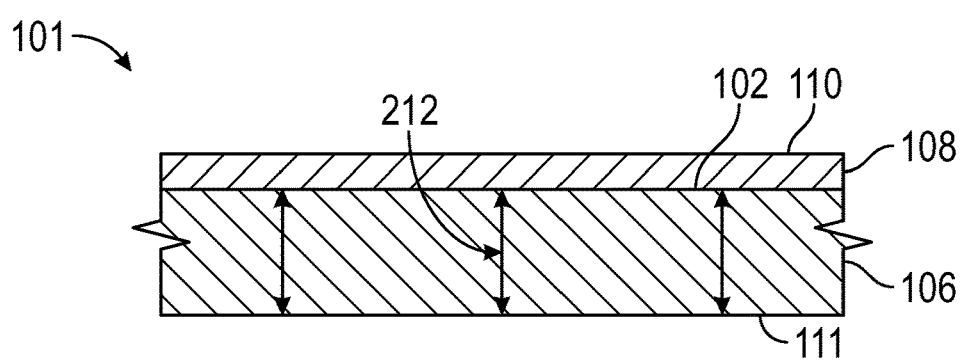

At operation 801, as shown in FIG. 9A, a base substrate 106 is planarized. A base substrate thickness distribution 212 is known across the base substrate 106 as the base substrate thickness distribution 212 is constant or substantially constant. The base substrate thickness distribution 212 is defined by the distance between the bottom surface 111 and an upper surface 102 of the base substrate 106 across the eyepiece area 101. The base substrate thickness distribution 212 is a measured thickness distribution of the base substrate 106 prior to forming the target thickness distribution 116.

At operation 802, a target thickness change is determined. The target thickness change is a thickness change required to form the target thickness distribution 116 from the base substrate thickness distribution 212. The target thickness change is determined using the equation:

$$\Delta T = T_{target} - T_{measured} + C$$

where $\Delta T$ is the target thickness change, $T_{target}$ is the target thickness distribution 116 (shown in FIGS. 1B-1E), $T_{measured}$ is the base substrate thickness distribution 212 found in operation 801, and C is the global shift corresponding to a location on the base substrate 106. In one embodiment, which can be combined with other embodiments described herein, the global shift constant is zero.

Figure 10A:
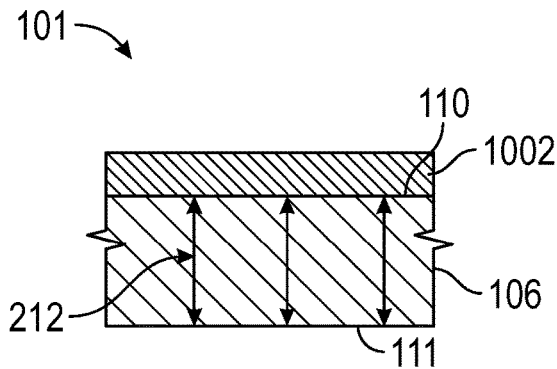
FIGS. 10A-10D are schematic, cross-sectional views of a substrate during a sub-method for forming a substrate with a target thickness distribution according to embodiments.
Figure 10B:
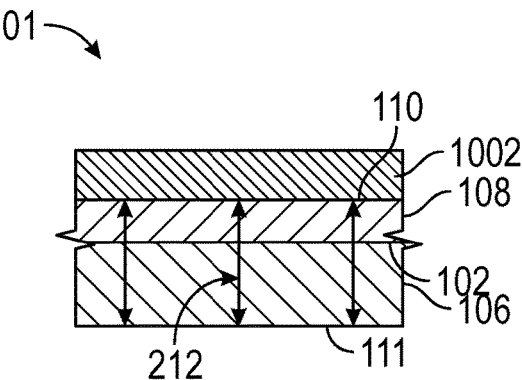

At optional operation 803, as shown in FIG. 10B, an index matched layer 108 is disposed over the base substrate 106. The index matched layer 108 may be disposed over the upper surface 102 of the base substrate 106 by one or more PVD, CVD, PECVD, FCVD, ALD, and spin-on processes. In one embodiment, which can be combined with other embodiments described herein, the index matched layer 108 has a refractive index that matches or substantially matches the refractive index of the base substrate 106.

At optional operation 804, one of the sub-method 400 or the sub-method 600 described above is performed. FIGS. 10A-10D are schematic, cross-sectional views of a base substrate 106 during a sub-method 400 for forming a substrate 100 with a target thickness distribution 116. At operation 401, as shown in FIGS. 10A and 10B, a resist 1002 is disposed. FIG. 10A shows the resist 1002 disposed over the base substrate 106. FIG. 10B shows the resist 1002 disposed over the index matched layer 108. The resist 1002 material may include, but is not limited to, light-sensitive polymer containing materials. The resist 1002 may be disposed by one or more PVD, CVD, PECVD, FCVD, ALD, and spin-on processes.

Figure 10C:
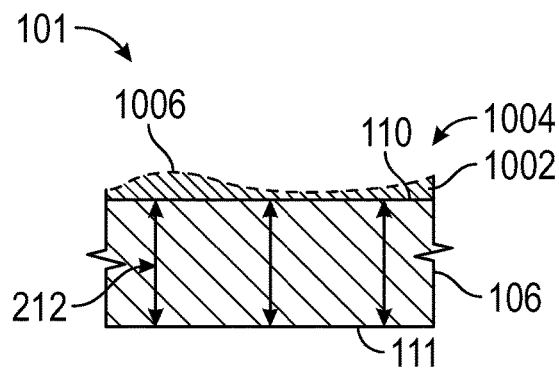
Figure 10D:
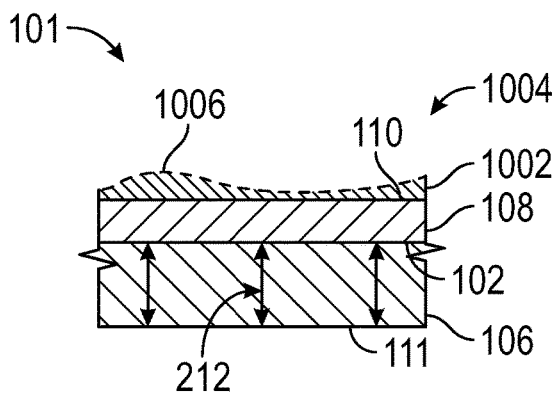

At operation 402, as shown in FIGS. 10C and 10D, the resist 1002 is developed. The resist 1002 is developed utilizing a lithography process. In one embodiment, which can be combined with other embodiments described herein, the lithography process is a gray-tone lithography process. The lithography process forms a gray-tone distribution 1004 of the resist 1002. Developing the resist 1002 may include performing a lithography process, such as photolithography and digital lithography. The gray-tone distribution 1004 has a thickness distribution 1006 that corresponds to the target thickness distribution 116 to be formed in the substrate 100. FIG. 10C shows the resist 1002 developed on the base substrate 106. FIG. 10D shows the resist 1002 developed on the index matched layer 108.

Figure 11A:
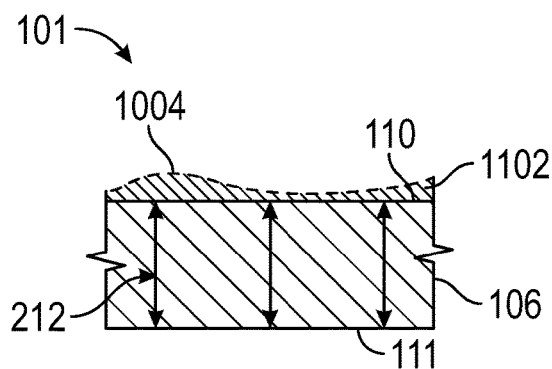
FIGS. 11A-11B are schematic, cross-sectional views of a substrate during a sub-method for forming a substrate with a target thickness distribution according to embodiments.
Figure 11B:
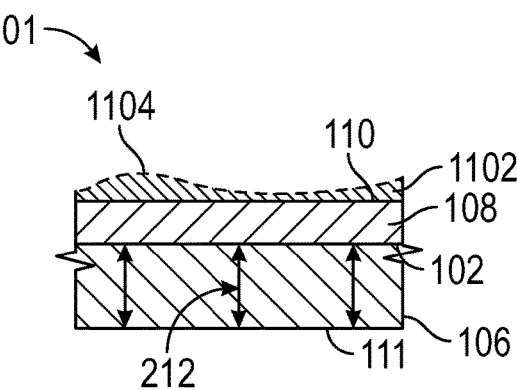

FIGS. 11A-11B are schematic, cross-sectional views of a base substrate 106 during a sub-method 600 for forming a substrate with a target thickness distribution 116. At operation 601, a resist 1102 is disposed. The material of the resist 1102 may include, but is not limited to, light-sensitive polymer containing materials. The resist 1102 may be disposed by an inkjet printing process to achieve a thickness distribution 1104 that corresponds to the target thickness distribution 116 to be formed in the substrate 100. FIG. 11A shows the resist 1102 disposed over the base substrate 106. FIG. 11B shows the resist 1102 disposed over the index matched layer 108.

Figure 9C:
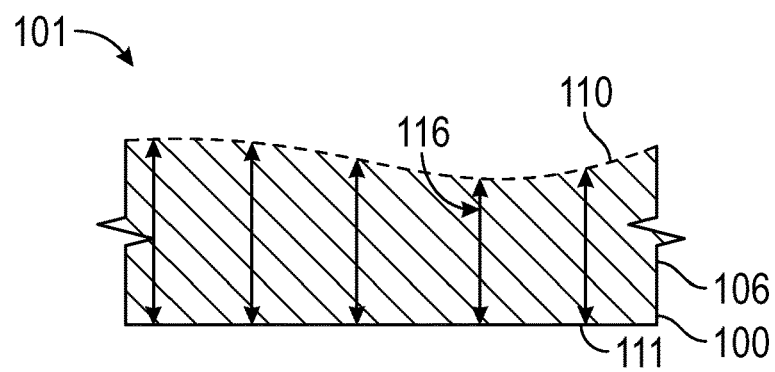
Figure 9D:
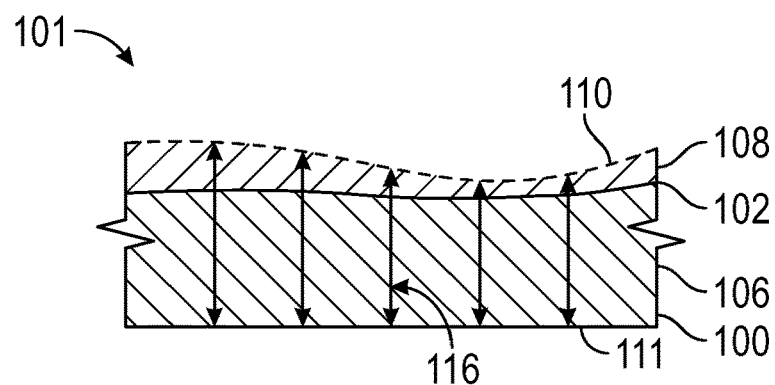

At operation 805, as shown in FIGS. 9C and 9D, a substrate 100 with the target thickness distribution 116 is formed. The target thickness change is utilized to determine the change to the base substrate thickness distribution 212 required to form the target thickness distribution 116. Determining the target thickness change provides for the processes of the operation 805 to be adjusted accordingly to form the target thickness distribution 116 as desired. FIG. 9C shows the target thickness distribution 116 formed in the base substrate 106 of the substrate 100. The substrate 100 of FIG. 9C corresponds to the eyepiece areas 101 shown in FIG. 1B. The substrate 100 of FIG. 9C corresponds to the eyepiece areas 101 and the inactive areas 104 shown in FIG. 1D. FIG. 9D shows the target thickness distribution 116 formed in the index matched layer 108 of the substrate 100. The substrate 100 of FIG. 9D corresponds to the eyepiece areas 101 and the inactive areas 104 shown in FIG. 1E.

In one embodiment, where the sub-method 400 or the sub-method 600 is performed, the target thickness distribution 116 is formed by performing a transfer etch. The transfer etch may include, but is not limited to, at least one of ion implantation, ion beam etching (IBE), reactive ion etching (RIE), directional RIE, plasma etching, and thermal atomic layer etching. The transfer etch produces the target thickness distribution 116 corresponding to the thickness distribution 1006 of the sub-method 400 or corresponding to the thickness distribution 1104 of the sub-method 600. Any residual portions of the resist 1002 or the resist 1102 disposed over the substrate 100 are removed.

In another embodiment, which can be combined with other embodiments described herein, when the sub-method 400 and the sub-method 600 are not utilized, the index matched layer 108 may be disposed on the base substrate 106 such that the index matched layer 108 accounts for the target thickness change and forms the substrate 100 having the target thickness distribution 116. The index matched layer 108 may be disposed by an inkjet printing process to achieve the target thickness distribution 116. A mask may be utilized during the inkjet printing process to deposit the index matched layer 108 on the substrate 100.

In yet another embodiment, which can be combined with other embodiments described herein, when the sub-method 400 and the sub-method 600 are not utilized, the substrate 100 having the target thickness distribution 116 may be formed with a distribution etch process. The distribution etch process may include, but is not limited to, at least one of ion implantation, ion beam etching (IBE), reactive ion etching (RIE), directional RIE, plasma etching, and thermal atomic layer etching. The distribution etch process may directly etch the base substrate 106 or the index matched layer 108 to account for the target thickness change and form the substrate 100 having the target thickness distribution 116. In one embodiment, which can be combined with other embodiments described herein, the base substrate 106 may be angled and rotated such that the distribution etch process may form the target thickness distribution 116. Additionally, when the index matched layer 108 is disposed over the upper surface 102 of the base substrate 106, the distribution etch process may directly etch the index matched layer 108 to form the target thickness distribution 116.

The target thickness distribution 116 shown in FIGS. 9C and 9D is a result of utilizing the target thickness change of the method 800. The target thickness distribution 116 may be formed at each eyepiece area 101. Therefore, the target thickness distribution 116 across the substrate 100 at each eyepiece area 101 is the same. Each eyepiece area 101 having the target thickness distribution 116 will allow for reduced variability in the optical device eyepieces 1200A-1200C to be formed thereon.

FIGS. 12A-12C are schematic, cross-sectional views of optical device eyepieces 1200A-1200C. The optical device eyepieces 1200A-1200C are formed in a substrate 100. The optical device eyepieces 1200A-1200C include a plurality of optical device structures 1202. The plurality of optical device structures 1202 are formed in an eyepiece area 101 of the substrate. The eyepiece area 101 is an area of the substrate 100 where the optical device eyepieces 1200A-1200C are formed. The optical device eyepieces 1200A-1200C may be formed into the substrate 100 following the method 200 or the method 800. In one embodiment, which can be combined with other embodiments described herein, the optical device eyepieces 1200A-1200C may be formed in a device material (not shown) disposed over a top surface 110 of the substrate 100. The optical device eyepieces 1200A-1200C each have a target thickness distribution 116. The target thickness distribution 116 may be any linear or nonlinear distribution. The target thickness distribution 116 is the same at each of the eyepiece areas 101. The plurality of optical device structures 1202 are formed in the substrate 100 according to the target thickness distribution 116.

As shown in the optical device lens 1200A of FIG. 12A, the plurality of optical device structures 1202 are formed in a base substrate 106 of the substrate 100. As shown in the optical device eyepieces 1200B and 1200C of FIGS. 12B and 12C, the plurality of optical device structures 1202 are formed in an index matched layer 108 of the substrate 100. In other embodiments, which can be combined with other embodiments described herein, the plurality of optical device structures 1202 are formed in both the base substrate 106 and the index matched layer 108. The plurality of optical device structures 1202 may be nanostructures having sub-micron dimensions, e.g., nano-sized dimensions.

In one embodiment, which can be combined with other embodiments described herein, the optical device eyepieces 1200A-1200C are waveguide combiners, such as augmented reality waveguide combiners. In another embodiment, which can be combined with other embodiments described herein, the optical device eyepieces 1200A-1200C are flat optical devices, such as metasurfaces. The plurality of optical device structures 1202 may correspond to an input coupling grating or an output coupling grating of the optical device eyepieces 1200A-1200C. The optical device eyepieces 1200A-1200C are not limited to the number of the plurality of optical device structures 1202 shown in FIGS. 12A-12C. Although the plurality of optical device structures 1202 shown in FIGS. 1A-1C are angled relative to a bottom surface 111 of the substrate 100, the plurality of optical device structures 1202 may be perpendicular relative to the bottom surface 111 of the substrate 100.

In summation, methods of forming a substrate having a target thickness distribution at one or more eyepiece areas across a substrate are described herein. The substrate includes eyepiece areas corresponding to areas where optical device eyepieces are to be formed on the substrate. Each eyepiece area includes a target thickness distribution of the substrate. The target thickness distribution is to be formed at each eyepiece area utilizing the methods described herein. A base substrate thickness distribution of a base substrate is measured such that a target thickness change can be determined. The methods described herein are utilized along with the target thickness change to form a substrate with the target thickness distribution. The target thickness distribution at each eyepiece area being the same or substantially the same provides for a decrease in variation between each optical device lens formed at each eyepiece area. Additionally, the target thickness distribution can be engineered in a way that is beneficial to performance of the optical device eyepiece. Due to the formation of the target thickness distribution, it is not necessary to strictly control the thickness gradient of the substrates prior to performance of the methods described herein, such as with precise polishing processes. Therefore, material costs associated with precise polishing process are reduced.

While the foregoing is directed to embodiments of the present disclosure, other and further embodiments of the disclosure may be devised without departing from the basic scope thereof, and the scope thereof is determined by the claims that follow.

What is claimed is:

1. A waveguide, comprising:
   a base substrate, the base substrate having a base substrate thickness distribution;
   an index matching layer disposed over the base substrate, wherein the index matching layer and the base substrate have a target thickness distribution defined by a distance between a top surface of the index matching layer and a bottom surface of the base substrate, wherein the target thickness distribution is different than the base substrate thickness distribution; and
   a plurality of optical device structures.

2. The waveguide of claim 1, wherein a height of each optical device structure of the plurality of optical device structures is the same.

3. The waveguide of claim 2, wherein the plurality of optical device structures are nanostructures having sub-micron dimensions.

4. The waveguide of claim 3, wherein the plurality of optical device structures are acutely angled relative to a bottom surface of the base substrate.

5. The waveguide of claim 3, wherein the plurality of optical device structures are perpendicular relative to a bottom surface of the base substrate.

6. The waveguide of claim 3, wherein the plurality of optical device structures correspond to an input coupling grating or an output coupling grating of the optical device.

7. The waveguide of claim 1, wherein the waveguide is an augmented reality waveguide combiner.

8. The waveguide of claim 1, wherein the waveguide is a metasurface.

9. The waveguide of claim 1, wherein the indexed matching layer and the base substrate have a same refractive index.

10. A waveguide, comprising:
a base substrate, wherein the base substrate has a target thickness distribution, the target thickness distribution defined by a distance between a top surface and a bottom surface of the base substrate;
an index matching layer disposed over the base substrate; and
a plurality of optical device structures disposed on the index matching layer, wherein depths of at least two of the optical device structures from a top surface of the optical device structures to the indexed matching layer are different, the depths corresponding to the target thickness distribution, wherein the optical device is formed by:
measuring a base substrate thickness distribution across the base substrate;
determining a target thickness change, the target thickness change determined by subtracting the base substrate thickness distribution from the target thickness distribution;
forming the target thickness distribution in the base substrate by disposing a resist over the index matching layer and developing the resist utilizing a lithography process to form a gray-tone distribution having a thickness distribution corresponding to the target thickness distribution; and
forming the plurality of optical device structures wherein the plurality of optical device structures are formed based on the target thickness distribution.

11. The waveguide of claim 10, wherein the forming the target thickness distribution in the base substrate further includes performing a transfer etch into the base substrate, the transfer etch forming the target thickness distribution in the base substrate that corresponds to the thickness distribution of the gray-tone distribution.

12. The waveguide of claim 10, wherein the resist is disposed by one or more Physical Vapor Deposition (PVD), Chemical Vapor Deposition (CVD), Plasma-Enhanced Chemical Vapor Deposition (PECVD), Flowable Chemical Vapor Deposition (FCVD), Atomic Layer Deposition (ALD), or spin-on processes.

13. The waveguide of claim 10, wherein the forming the target thickness distribution in the base substrate includes performing a distribution etch process, the distribution process etch forming the target thickness distribution by directly etching into the base substrate to account for the target thickness change.

14. The waveguide of claim 13, wherein the distribution etch process includes at least one of ion beam etching (IBE), reactive ion etching (RIE), directional RIE, plasma etching, or thermal atomic layer etching.

15. The waveguide of claim 10, wherein the forming the target thickness distribution in the base substrate includes disposing a resist over the base substrate with an inkjet printing process, the resist having a thickness distribution corresponding to the target thickness distribution and performing a transfer etch into the base substrate, the transfer etch forming the target thickness distribution in the base substrate.

16. A substrate, comprising:
a plurality of inactive areas;
a plurality of eyepiece areas disposed between the plurality of inactive areas, wherein each eyepiece area includes a target thickness distribution across each of the plurality of eyepiece areas, the target thickness distribution defined by a distance between a top surface and a bottom surface of the substrate at each of the plurality of eyepiece areas; and
an optical device formed at each of the plurality of eyepiece areas, each optical device having a plurality of optical device structures, wherein depths of at least two of the optical device structures are different and correspond to the target thickness distribution.

17. The substrate of claim 16, wherein a height of each optical device structure of the plurality of optical device structures is the same, each height is a distance from a top of a respective optical device structure along the top surface of the target thickness distribution to a bottom of the respective optical device structure.

18. The substrate of claim 16, wherein the plurality of inactive areas include the target thickness distribution.

19. The substrate of claim 16, wherein each of the plurality of the eyepiece areas has the same target distribution.

20. The substrate of claim 16, wherein the optical device formed at each of the plurality of eyepiece areas are augmented waveguide combiners.

* * * * *